(12) United States Patent
Paietta et al.

(10) Patent No.: US 11,808,248 B2
(45) Date of Patent: Nov. 7, 2023

(54) METHOD AND SYSTEM FOR PERFORMING CONDITION MONITORING OF WIND TURBINE COMPONENTS

(71) Applicants: Margaret Paietta, Royersford, PA (US); Gregory Wolfe, Royersford, PA (US)

(72) Inventors: Margaret Paietta, Royersford, PA (US); Gregory Wolfe, Royersford, PA (US)

(73) Assignee: Fischer Block, Inc., West Chester, PA (US)

( * ) Notice: Subject to any disclaimer, the term of this patent is extended or adjusted under 35 U.S.C. 154(b) by 0 days.

(21) Appl. No.: 17/437,516

(22) PCT Filed: Feb. 18, 2021

(86) PCT No.: PCT/US2021/018449
§ 371 (c)(1),
(2) Date: Sep. 9, 2021

(87) PCT Pub. No.: WO2021/168030
PCT Pub. Date: Aug. 26, 2021

(65) Prior Publication Data
US 2022/0389912 A1 Dec. 8, 2022

Related U.S. Application Data

(60) Provisional application No. 62/978,043, filed on Feb. 18, 2020.

(51) Int. Cl.
*F03D 17/00* (2016.01)
*G01R 31/34* (2020.01)

(52) U.S. Cl.
CPC ........... *F03D 17/00* (2016.05); *G01R 31/343* (2013.01)

(58) Field of Classification Search
CPC ........ G01R 31/343; F03D 17/00; Y02E 10/72
(Continued)

(56) References Cited

U.S. PATENT DOCUMENTS

| 5,519,337 A | 5/1996 | Casada |
| 10,768,072 B2 * | 9/2020 | Bechhoefer ........... G01M 13/00 |

(Continued)

FOREIGN PATENT DOCUMENTS

CN 111582392 B * 3/2021 ........... G06N 3/0454

OTHER PUBLICATIONS

International Search Report dated Jun. 14, 2021 for International Patent Application No. PCT/US2021/018449, 2 pages.
(Continued)

*Primary Examiner* — John H Le
(74) *Attorney, Agent, or Firm* — Morgan, Lewis & Bockius LLP

(57) ABSTRACT

A technique for performing condition monitoring of a plurality of components of a plurality of wind turbines is disclosed. The technique includes, for each of the plurality of wind turbines, measuring at least one time-series electrical output signal of the wind turbine generator, each time-series electrical output signal representing an aggregate of a plurality of subset signals. Such condition monitoring further includes mathematically extracting one or more such subset signals from the at least one time-series electrical output signal of the generator, and associating one or more such subset signals with one or more wind turbine components. A fault threshold value for each such one or more subset signals may be determined, and the one or more such subset signals are compared to such fault threshold value. Based on such association and comparison, the condition of such a wind turbine component of the plurality of wind turbines is determined.

82 Claims, 9 Drawing Sheets

(58) Field of Classification Search
USPC .......................................................... 702/58
See application file for complete search history.

(56) References Cited

U.S. PATENT DOCUMENTS

| | | |
|---|---|---|
| 2013/0049733 A1 | 2/2013 | Neti et al. |
| 2013/0261988 A1 | 10/2013 | Lim et al. |
| 2014/0163904 A1 | 6/2014 | Bechhoefer et al. |
| 2017/0104346 A1 | 4/2017 | Wenzel et al. |

OTHER PUBLICATIONS

Written Opinion dated Jun. 14, 2021 for International Patent Application No. PCT/US2021/018449, 11 pages.
International Preliminary Report on Patentability dated Aug. 23, 2022 for International Patent Application No. PCT/US2021/018449, 12 pages.

* cited by examiner

WIND TURBINE OF INTEREST: T4
HISTORICAL REFERENCE: TURBINE T4
SUBSET SIGNAL: 6.4 HERTZ

| TOTAL OUTPUT CURRENT BAND (AMPS) | PERCENTAGE OF TOTAL OUTPUT CURRENT | | | |
|---|---|---|---|---|
| | HISTORICAL MEAN (TURBINE: T4) | HISTORICAL STANDARD DEVIATION (TURBINE: T4) | FAULT THRESHOLD LEVEL | ACCEPTABLE # OF STANDARD DEVIATIONS FROM MEAN |
| A | B | C | D = B + CD | E ( > 0) |
| 0-10 | 1.800 | 0.360 | 2.88 | 3.00 |
| 10-30 | 1.300 | 0.260 | 2.21 | 3.50 |
| 30-50 | 1.100 | 0.220 | 1.87 | 3.50 |
| 50-70 | 1.000 | 0.200 | 1.80 | 4.00 |
| 70-90 | 0.900 | 0.180 | 1.44 | 3.00 |
| 90-110 | 0.800 | 0.160 | 1.28 | 3.00 |
| 110-130 | 0.700 | 0.140 | 1.12 | 3.00 |
| 130-150 | 0.600 | 0.120 | 1.02 | 3.50 |
| 150-170 | 0.500 | 0.100 | 0.90 | 4.00 |
| 170-190 | 0.350 | 0.070 | 0.61 | 3.75 |
| 190-210 | 0.220 | 0.110 | 0.66 | 4.00 |
| 210-230 | 0.150 | 0.030 | 0.24 | 3.00 |
| 230-250 | 0.125 | 0.100 | 0.43 | 3.00 |
| 250-270 | 0.100 | 0.020 | 0.17 | 3.50 |

| PERCENTAGE OF TOTAL OUTPUT CURRENT | | EXCEEDS FAULT THRESHOLD (YES OR NO?) | HEALTH CONDITION INDEX (FAULT SEVERITY) |
|---|---|---|---|
| MEASUREMENT OF INTEREST (TURBINE: T4) | # OF STANDARD DEVIATIONS FROM HISTORICAL MEAN | | |
| F | G: (F - B) / C | H: YES IF (G > E) | I: G / E |
| 1.980 | 0.500 | | 0.167 |
| 1.350 | 0.192 | | 0.055 |
| 1.408 | 1.400 | | 0.400 |
| 1.250 | 1.250 | | 0.313 |
| 0.702 | 1.100 | | 0.367 |
| 1.032 | 1.450 | | 0.483 |
| 0.735 | 0.250 | | 0.083 |
| 0.570 | 0.250 | | 0.071 |
| 0.445 | 0.550 | | 0.138 |
| 0.411 | 0.875 | | 0.233 |
| 1.300 | 9.818 | YES | 2.455 |
| 0.108 | 1.400 | | 0.467 |
| 0.250 | 1.250 | | 0.417 |
| 0.114 | 0.700 | | 0.200 |

FIG. 6A

METHOD AND SYSTEM FOR PERFORMING CONDITION MONITORING OF WIND TURBINE COMPONENTS

CROSS-REFERENCE TO RELATED APPLICATIONS

The present application is a U.S. National Phase of International Patent Application no. PCT/US2021/018449, filed Feb. 18, 2021, which claims priority from U.S. Provisional Application 62/978,043, filed Feb. 18, 2020, the entire contents of which are incorporated herein by reference.

FIELD OF THE INVENTION

The present disclosure relates to monitoring one or more conditions of a wind turbine. More particularly, the present disclosure relates to a technique in which the electrical output signal of the wind turbine generator is monitored to detect operational degradation of various components of the wind turbine, e.g. windings, shafts, and bearings, so that action can be taken to avoid wind turbine failure. The present disclosure further relates to a condition monitoring system for a wind turbine, to a wind turbine comprising a condition monitoring system, and to a wind farm.

BACKGROUND OF THE DISCLOSURE

Historically, assessing the health of one or more wind turbine components has consisted primarily of monitoring the physical vibration of various such components of a wind turbine. These techniques have several shortcomings as compared to the present disclosure. For example, such vibration monitoring systems are difficult to install requiring numerous physical sensors (e.g., vibration sensors), each required to be physically mounted in unique (separate) physical locations within the wind turbine. Further, each sensor may require individual wire connections from a central monitoring unit, whereby such vibration sensing modules and wires become safety trip hazards to technicians who commonly are required to work in, on, and around the various components of a wind turbine system.

Moreover, typical vibration monitoring methods and systems are, by design, only capable of detecting physical vibrations and thus, are unable to detect degradation in wind turbine components for those type of components which either do not vibrate or in which such component's vibration does not change with operational performance degradation, e.g., rotor bars and stationary windings. As such, wind turbine component monitoring methods which utilize mechanical vibration signal monitoring techniques are unable to detect many types of degradation of components within the electrical sub-systems of wind turbines.

SUMMARY

A system and method are provided for performing condition monitoring of a plurality of components of a plurality of wind turbines is disclosed. The disclosed techniques include, for each of the plurality of wind turbines, measuring at least one time-series electrical output signal of the wind turbine generator, each time-series electrical output signal representing an aggregate of a plurality of subset signals. Such condition monitoring further includes mathematically extracting one or more such subset signals from the at least one time-series electrical output signal of the generator, and associating one or more such subset signals with one or more wind turbine components. A fault threshold value for each such one or more subset signals may be determined, and the one or more such subset signals are compared to such fault threshold value. Based on such association and comparison, the condition of such a wind turbine component of the plurality of wind turbines is determined.

BRIEF DESCRIPTION OF FIGURES

FIG. 6A is, for one embodiment, a table showing, for a specific wind turbine, the relationship between a plurality of subset signals of interest, and their respective fault threshold values and health condition indexes, according to at least one embodiment.

DESCRIPTION OF THE DISCLOSURE

Figure 1:
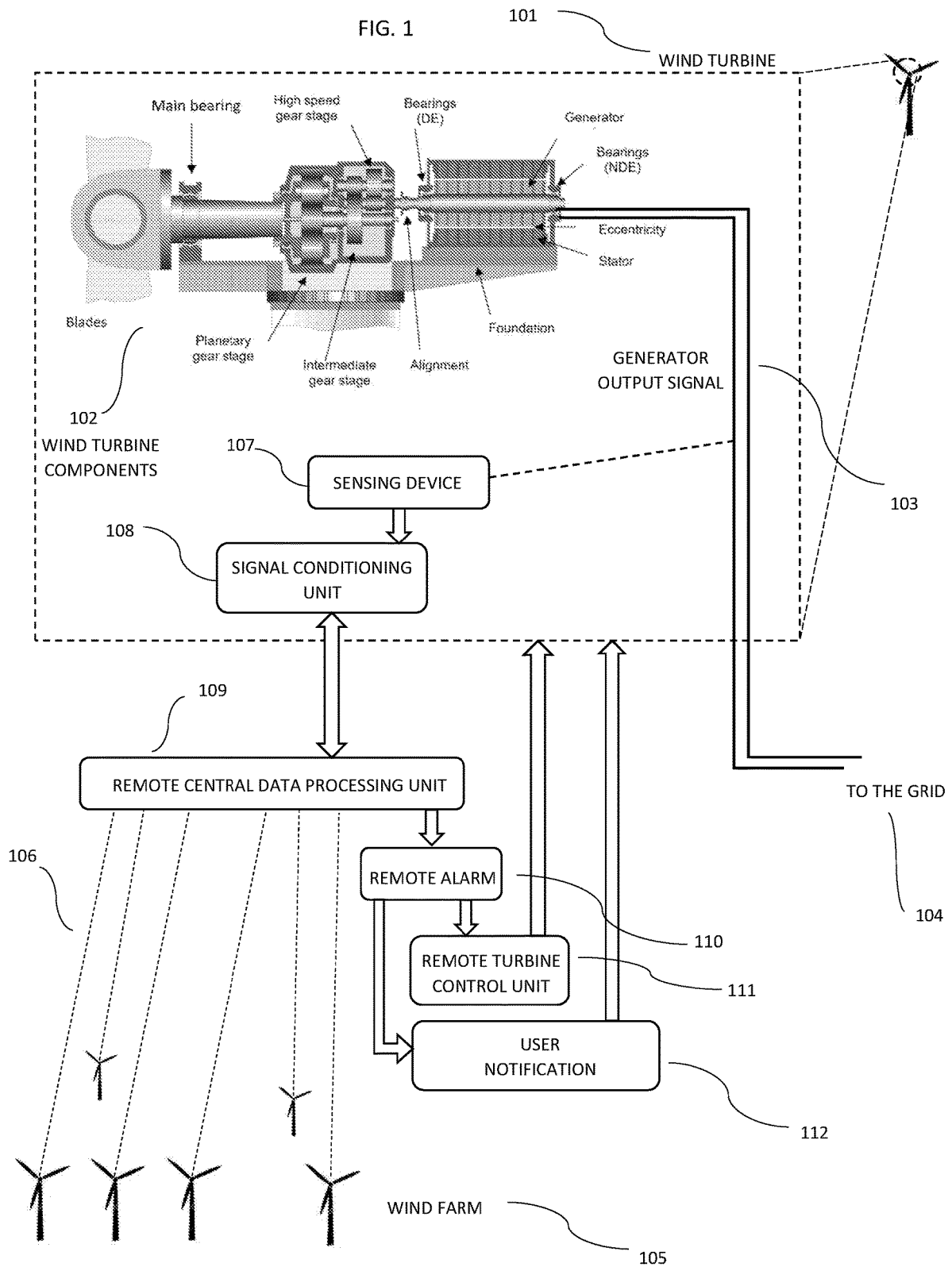
FIG. 1 is, according to one embodiment of the disclosure, a schematic diagram of a plurality of wind turbines such as on a wind farm in which condition monitoring is performed according to at least one embodiment.

It is an object of some embodiments of the disclosure to provide a method for performing condition monitoring on a plurality of wind turbines arranged in a wind farm, the method allowing faults or malfunction of one or more wind turbine components to be readily detected.

It is a further object of some embodiments of the disclosure to provide a method for performing condition monitoring on a plurality of wind turbines arranged in a wind farm, the method allowing effective use of a generator electrical output signal.

It is an even further object of some embodiments of the disclosure to provide a condition monitoring system for a wind turbine, the condition monitoring system being capable of readily detecting faults or malfunction of one or more wind turbine components.

According to a first aspect of the disclosure there is provided a method for performing condition monitoring of a plurality of components of a plurality of wind turbines, arranged in a wind farm. The method may include, for each of the plurality of wind turbines, measuring at least one time-series electrical output signal of the wind turbine generator, each time-series electrical output signal representing an aggregate of a plurality of subset signals. The method may further include mathematically extracting one or more such subset signals from the at least one time-series electrical output signal of the generator, associating one or more such subset signals with one or more wind turbine components, determining a fault threshold value for each such one or more subset signals, comparing the one or more such subset signals to such fault threshold value, and determining the condition of such at least one wind turbine component of the plurality of wind turbines based on such association and comparison.

In the present context, the term 'condition monitoring of a wind turbine' may refer to a process in which the health condition of the wind turbine and/or of one or more components of the wind turbine is monitored. For instance, it may be monitored whether or not a given wind turbine component is operating as it is supposed to, i.e. whether or not a given wind turbine component is failing, faulty, malfunctioning and/or operating in a non-optimal manner. Monitored wind turbine components may include components within both the mechanical and electrical sub-systems within the wind turbine, e.g. bearings and stationary windings. In the present context, the term 'wind farm' may refer to two or more wind turbines arranged at a wind turbine site.

In the present context, the term 'measuring a time-series electrical output signal of a wind turbine generator' may refer to a process in which the electrical output signal is sampled several times during at least one frequency cycle, with substantially equal time intervals between successive samples, i.e., at a given sample rate. Accordingly, a plurality of sampled values are created such that the number of subset signals mathematically extracted from such time-series sampled values, and the frequency resolution of each such subset signal, can both be derived on the basis of the rate at which such values are sampled and the number of values sampled. For instance, the number of subset signals mathematically extracted from a time-series electrical output signal of a wind turbine generator and the frequency resolution of each such subset signal may be calculated using formulas of the form:

$$\#SS_{signals} = N/2$$

$$F\{SS_{resolution}\} = SR/N,$$

where $\#SS_{signals}$ is equal to the number of extracted subset signals, N is equal to the number of values sampled, $F\{SS_{resolution}\}$ is equal to the frequency resolution of each subset signal, and SR is equal to the rate at which values are sampled. The step of mathematically extracting one or more subset signals from a time-series electrical output signal may include performing one or more frequency transforms on the time-series electrical output signal of the wind turbine generator. As such the subset signals may be iteratively deconstructed from the such time-series electrical output signal in such a fashion in which, when mathematically added together, such added subset signals substantially reconstruct the such time-series electrical output signal.

The step of associating one or more subset signals with one or more wind turbine components may include calculating at least one of a product and a ratio between:

- a frequency of a subset signal and the frequency of the time-series electrical signal output of the generator,
- a frequency of a first subset signal with the frequency of a second subset signal,
- a frequency of a subset signal and a frequency of a rotating element within the wind turbine,
- a frequency of a first subset signal and a frequency of a second subset signal,
- a frequency of a subset signal and the number of pole pairs within the generator of the wind turbine,
- a frequency of a subset signal and the number of rotor bars within the generator of the wind turbine,
- a frequency of a subset signal and the number of stator winding slots within the generator of the wind turbine,
- a frequency of a subset signal and the number of rolling elements within a bearing case within the generator of the wind turbine,
- the number of teeth on a first gear and with the number of teeth on a second gear within the wind turbine, and
- a frequency of a subset signal and the physical motion of one or more moving elements within the drivetrain.

For instance, associating one or more subset signals with one or more wind turbine rotor bars may be calculated using a formula of the form:

$$F\{SS_{rotor\ bar}\} = F_{output} \pm 2(F_{output} - F\{SS_{rs}\}\#pp),$$

wherein $F\{SS_{rotor\ bar}\}$ is the frequency of the subset signal calculated to be associated with one or more rotor bars within the wind turbine, $F_{output}$ is the frequency of the time series electrical output signal to the grid, as generated by the wind turbine, $F\{SS_{rs}\}$ is the frequency of the subset signal associated with the rotational speed of the rotor cage within the wind turbine generator, and #pp is the number of pole-pairs within the generator. A subset signal associated with one or more wind turbine rotor bars may comprise of at least one frequency sideband near the wind turbine output frequency, the difference of which is determined by the speed of the rotor cage multiplied by the number of pole-pairs in the generator.

According to one embodiment of the disclosure, at least one generator output electrical signal is initially measured for each of the wind turbines of the wind farm. Each generator output electrical signal may be comprised of an aggregate of subset signals, each of which is associated with one or more monitored components of the wind turbine. As described above, generator electrical output signals contain useful information regarding the health condition of wind turbine components in both the mechanical and electrical wind turbine sub-systems, and accordingly such signals are very suitable for condition monitoring purposes. The generator electrical output signal may be measured with one or more sensors operationally coupled to one or more generator electrical output signals.

A given generator electrical output signal may contain an aggregate of subset signals whereby one or more such subset signals may represent the operational performance of a single monitored component. As an alternative, a given subset signal may represent the operational performance of two or more different components which may be mechanically or electrically related or operationally coupled to each other.

Similarly, operational performance of a given monitored component may be represented by only a single subset signal. Alternatively, operational performance of a given monitored component may be represented by a combination of two or more subset signals.

Next, a plurality of health condition indexes may be generated. Each health condition index corresponding to one or more monitored components, i.e., a health condition index may be generated for each of the monitored components. Health condition indexes may be generated on the basis of one or more of the subset signals, preferably on the basis of the subset signal(s) which represent(s) the monitored component in question.

The step of comparing the subset signal to its fault threshold level may include calculating a health condition index, whereby such calculation may include calculating the ratio between the value of the subset signal and the value of the threshold fault level assigned to such subset signal. For instance, calculating a health condition index for one or more wind turbine components may be calculated using a formula of the form:

$$HCI_n = ((V\{SS_n\} - HM\{SS_n\})/HSTD\{SS_n\})/((FTL\{SS_n\} - HM\{SS_n\})/HSTD\{SS_n\}),$$

where $HCI_n$ is the health condition index for a given, ie., $n^{th}$ subset signal corresponding to one or more wind turbine components, $V\{SS_n\}$ is equal to the value of the $n^{th}$ subset signal, $HM\{SS_n\}$ is the mean of the historical values of the $n^{th}$ subset signal, $HSTD\{SS_n\}$ is the standard deviation of the historical values of the $n^{th}$ subset signa., and $FTL\{SS_n\}$ is the fault threshold level of the $n^{th}$ subset signal. When the $HCI_n$ exceeds a predetermined acceptable level, alarm notifications may be initiated so that wind turbine control actions and/or preventative action may be taken in order to reduce the value of $V\{SS_n\}$, and hence $HCI_n$ as observed during subsequent executions of the method. In summary, each of the generated health condition indexes provides a good indication of the health condition of a given component of a given wind turbine of the wind farm, since it represents the operational performance level of said component.

In one embodiment, the health condition indexes, originating from the same wind turbine over various historical time periods, are compared, and the condition of each of the monitored components of the given wind turbine is evaluated, based on the comparison. Since the comparisons can take place over a historically long period of time, a vast amount of data is available, thereby improving the accuracy of the evaluation. Furthermore, this makes it very easy to detect a wind turbine which begins to behave differently from its historical norm. This is an advantage because this may very well be an indication that this wind turbine, or one or more components of this wind turbine, is failing or operating in a non-optimal manner.

In another embodiment the health condition indexes originating from different wind turbines of the wind farm are compared, and the condition of each of the monitored components of the plurality of wind turbines is evaluated, based on the comparison. Since the comparison takes place at wind farm level, i.e. health condition indexes originating from different wind turbines are compared, a vast amount of data is also available, thereby improving the accuracy of the evaluation. Furthermore, this makes it very easy to detect a wind turbine which behaves differently from the other wind turbines of the wind farm. This is an advantage because this may very well be an indication that this wind turbine, or one or more components of this wind turbine, is failing or operating in a non-optimal manner.

In one embodiment, the method may further comprises the steps of grouping the generated health condition indexes according to wind farm and/or according to turbine type, and/or according to turbine and/or according to monitored component and/or according to monitored components with related functions within the wind turbine and/or according to total electrical generator output level of the wind turbine generator at the time of measurement, and displaying the grouped health condition indexes accordingly. Such grouping and displaying of the generated health condition indexes makes it very easy to compare the health condition indexes on a wind turbine and/or wind farm level, and to detect any deviations which may indicate that a wind turbine, or a component of a wind turbine, is faulty or failing or, according to its performance as measured over time, i.e., trendline, will ultimately fail if preventative action is not taken prior to its failure.

In one embodiment, the method may further comprise the steps of outputting an alert when one or more health condition indexes exceeds a fault threshold value. Such alert output may be comprised of either a control signal or a notification to a user. In such a case, a control signal may be used to modify or alter the wind turbines operating conditions so as to favorably reduce the severity of one or more measured subset signals below the corresponding fault threshold level or levels. An output alert in the form of a user notification may be used to cause a user to make a repair or inspection on the identified wind turbine component if, as in one embodiment, the control adjustments were unable to reduce the severity of a subset signal into a region below a fault threshold level.

According to a second aspect, the disclosure provides a condition monitoring system for a wind turbine, the condition monitoring system being configured to perform the operations described according to various embodiments provided in the present disclosure. Thus, the condition monitoring system is capable of detecting faults or failures in wind turbine components in an easy and reliable manner.

According to a third aspect, the disclosure provides a wind turbine comprising a condition monitoring system according to the second aspect of the disclosure.

According to a fourth aspect, the disclosure provides a wind farm comprising a plurality of wind turbines, at least one of the wind turbines being a wind turbine according to the third aspect of the disclosure.

Referring to FIG. 1, wind farm 105 comprising a plurality of wind turbines 101, seven of which are shown. Each wind turbine 101 is equipped with a sensing device 107 arranged near the generator output 103, going out to the grid 104, which it is desired to monitor.

For each of the wind turbines, the sensing device 107 communicates measured signals to a signal processing unit 108. The signal processing unit 108 processes and forwards 106 the processed signals to a remote central data processing unit 109 which is located remotely with respect to the individual wind turbine 101 and centrally within a population of wind turbines such as a wind farm 105. The remote central data processing unit 109 is capable of determining whether or not any of the monitored components 102 of a wind turbines 101 are operating as they are supposed to. For example, such operational determination may include further processing and comparing the processed signals to historical processed signals on one or both of an individual wind turbine basis and on wind turbine population basis such as a wind farm. This comparison may be used to generate a health condition index each such one or more wind turbine components 102.

In the case that it is determined that a given component 102 is faulty or failing, the central processing unit 108 generates a remote alarm 110 which can be used to either automatically adjust the operating conditions of the wind turbine 2 via remote turbine control unit 111. Alternatively or additionally, the central processing unit 108 may notifies users, via user notification 112, that a component 102 is faulty or failing so that appropriate action can be taken to avoid further component degradation. Such action may include inspection or repair of said faulty or failing component or may lead to further adjustment of the operating conditions of the wind turbine to extend the life of such faulty or failing component.

The central data processing unit 109 may, e.g., group the generated health condition indexes according to wind farm 105 and/or according to turbine type, and/or according to turbine 101 and/or according to monitored component and/or according to monitored components with related functions within the wind turbine and/or according to total electrical generator output level of the wind turbine generator at the time of measurement. The central data processing unit 109 may display the grouped health condition indexes accordingly so that components exhibiting the most severe degradation in health are easily seen by users of the disclosure.

Figure 2A:
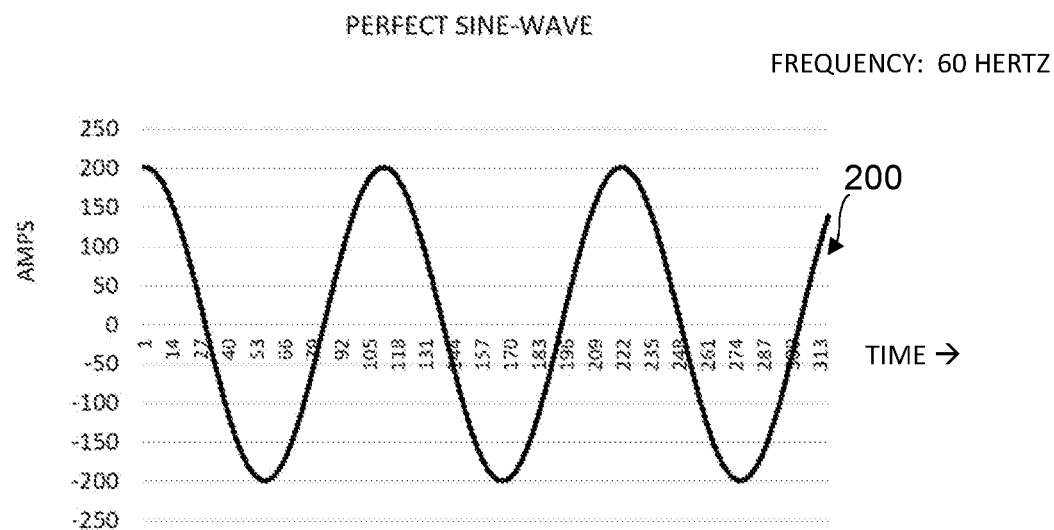
FIG. 2A is a graph of a continuous time-series signal representing an electrical output to the grid according to at least one embodiment.

Referring to FIG. 2A, a graph 200 shows a continuous time-series signal, in the shape of a perfect sine-wave. The signal represents an electrical output to the grid as would be generated by a perfectly healthy wind turbine void of any anomalous conditions and/or degrading components within the wind turbine according to at least one embodiment.

Figure 2B:
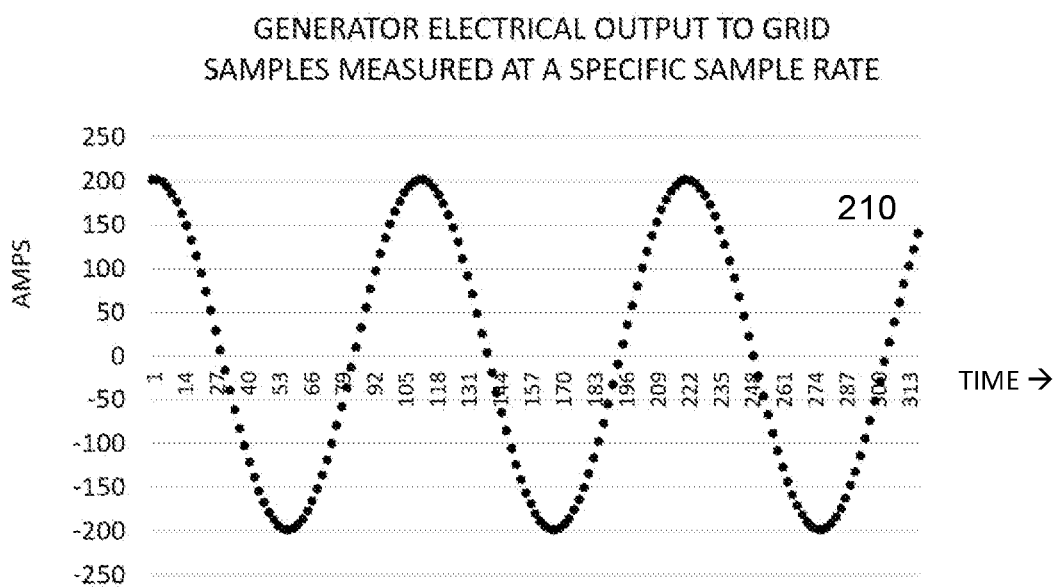
FIG. 2B shows the samples which are recorded at a specific sample rate for a specific number of samples taken from the continuous time-series signal shown in the graph of FIG. 2A according to at least one embodiment.
Figure 2C:
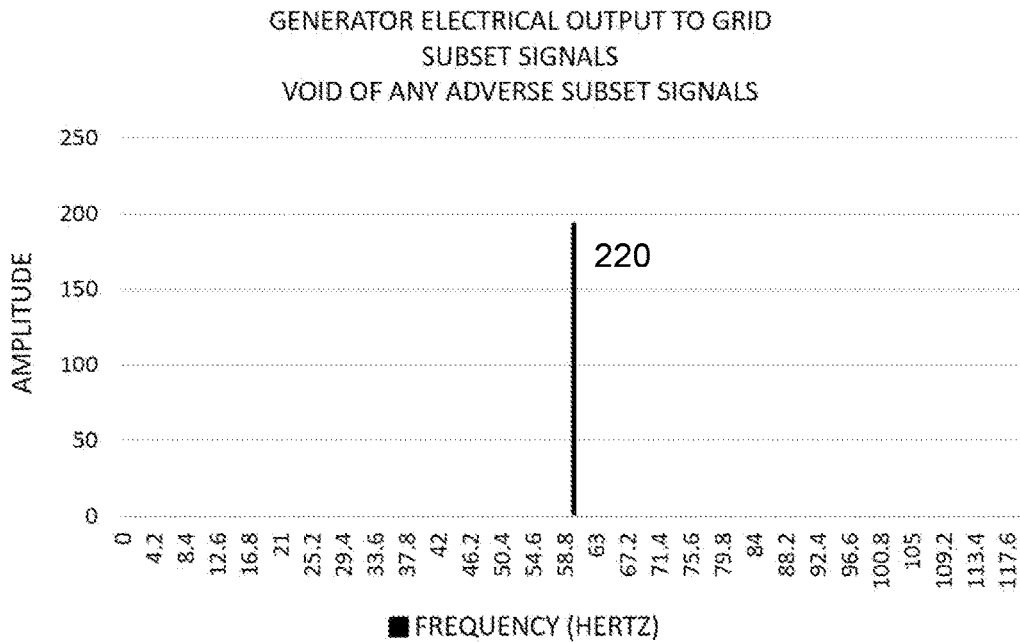
FIG. 2C is an amplitude plot showing the subset signals which are mathematically extracted from the samples FIG. 2B according to at least one embodiment.

FIG. 2B shows samples 210, which are recorded at a specific sample rate (SR) for a specific number of samples (N) taken from the continuous time-series signal shown in the graph 200 of FIG. 2A according to at least one embodiment. Relatedly, FIG. 2C shows an amplitude plot 220 illustrating the subset signals which are mathematically extracted from the samples FIG. 2B according to at least one embodiment. Note that a perfect sine-wave signal contains only one significant subset signal, whereby the amplitude and frequency of such significant subset signal are substantially equal to the amplitude and frequency of the sine-wave signal, respectively.

Figure 3A:
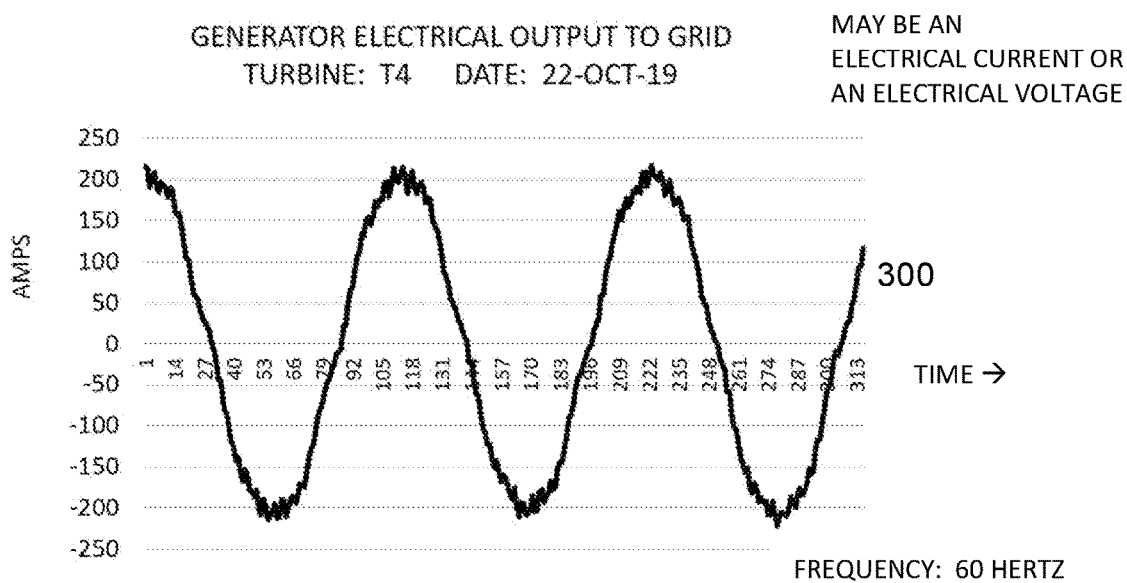
FIG. 3A is a graph of a continuous time-series electrical output to the grid according to at least one embodiment.

Referring to FIG. 3A, a graph 300 of a continuous time-series electrical output to the grid is illustrated. As shown, graph 300 is in the general shape of a sine-wave, with imperfections, as would be generated by a typical wind turbine on a specific date/time (T4, 22 Oct. 2019 as shown), which may contain anomalous conditions and/or degrading components within the wind turbine according to at least one embodiment.

Figure 3B:
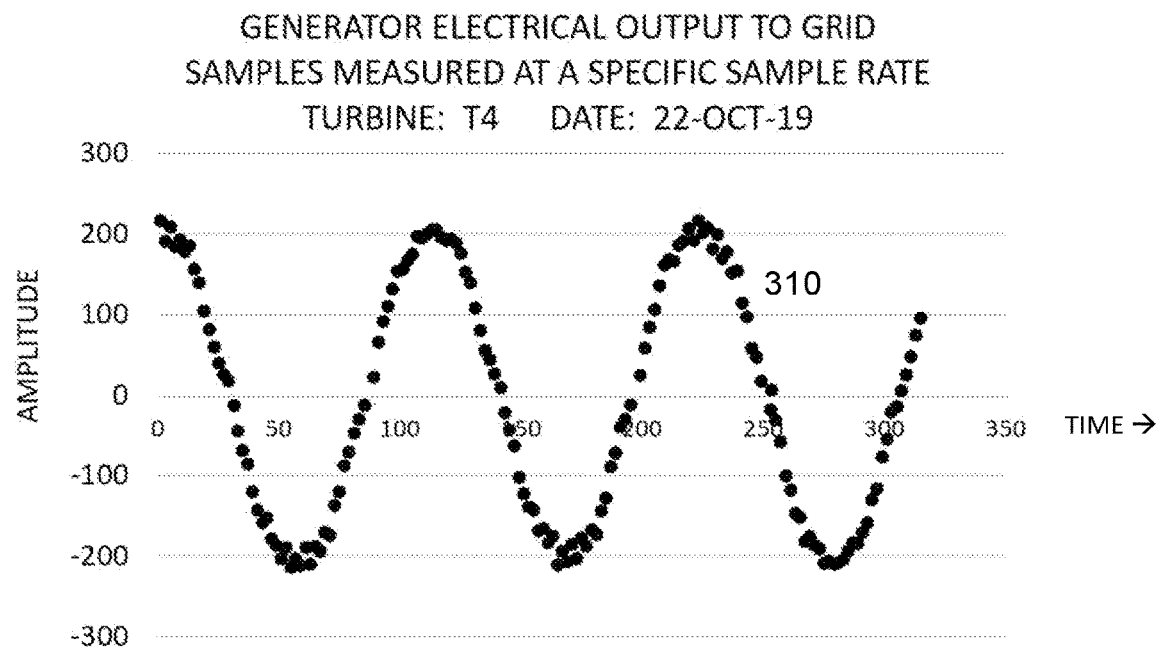
FIG. 3B shows the samples which are recorded at a specific sample rate for a specific number of samples taken from the continuous time-series electrical signal shown in the graph of FIG. 3A according to at least one embodiment.
Figure 3C:
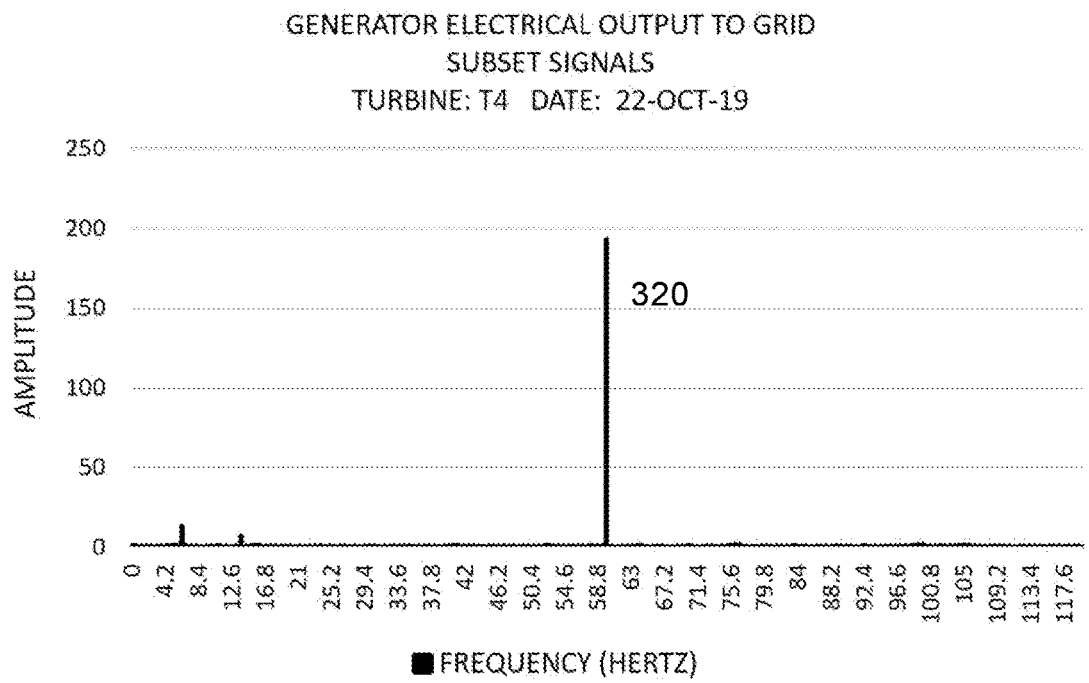
FIG. 3C is an amplitude plot showing the subset signals which are mathematically extracted from the samples of FIG. 3B according to at least one embodiment.
Figure 3D:
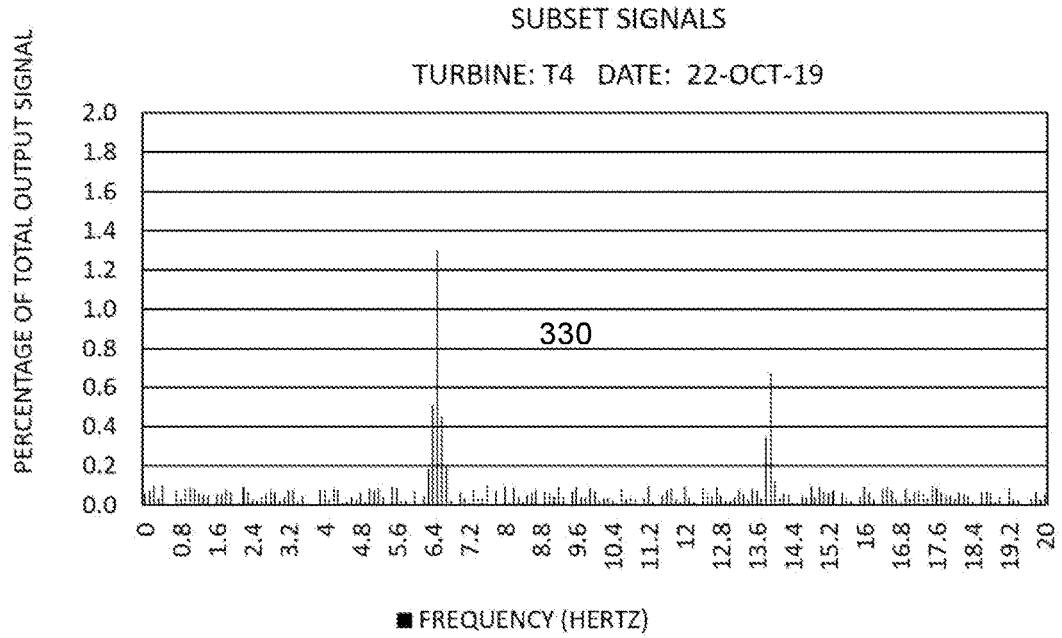
FIG. 3D is an amplitude percentage plot showing a relevant portion of subset signals of FIG. 3C according to at least one embodiment.

FIG. 3B shows samples 310, which are recorded at a specific sample rate (SR) for a specific number of samples (N) taken from the continuous time-series electrical signal shown in the graph 300 of FIG. 3A according to at least one embodiment. Relatedly, FIG. 3C shows an amplitude plot 320 illustrating the subset signals which are mathematically extracted from the samples of FIG. 3B according to at least one embodiment. Note that an imperfect sine-wave signal contains a plurality of subset signals, each at a specific and unique frequency, with varying amplitudes. Such plurality of subset signals, when each is mathematically converted back to the time domain, and added together, substantially recreate the time-series signal from which such plurality of subset samples were extracted. Further, FIG. 3D provides an amplitude percentage plot 330 showing a relevant portion of subset signals of FIG. 3C. Each such subset signal is shown as an amplitude percentage of the representative time-series electrical output signal from which such subset signal was generated according to at least one embodiment.

Figure 4A:
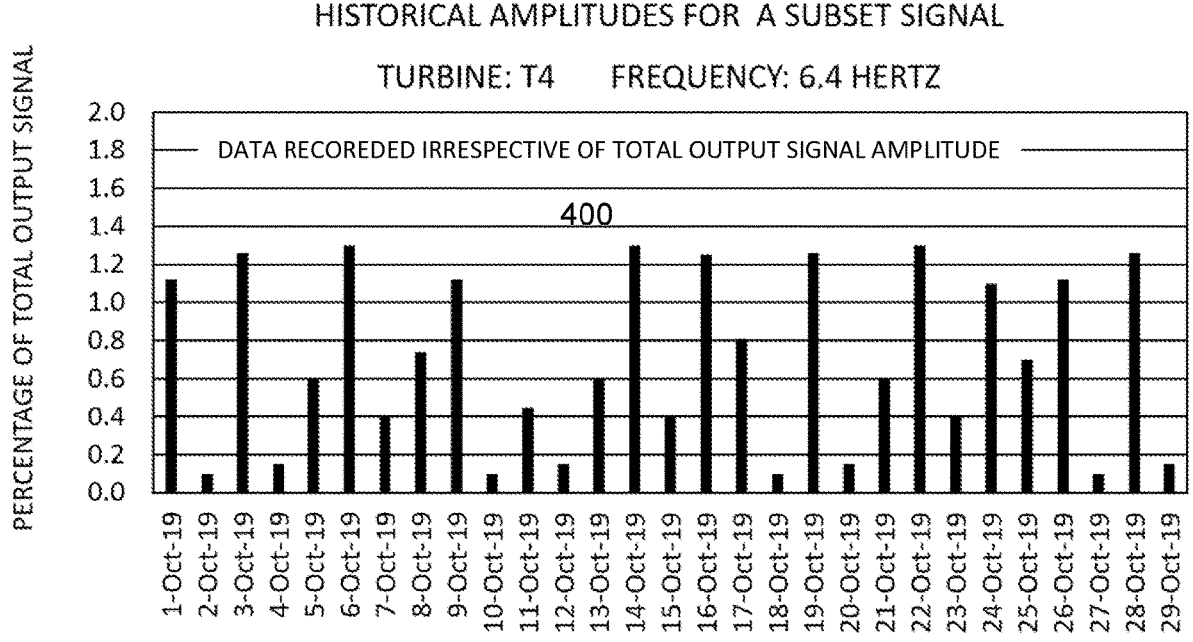
FIG. 4A is an amplitude percentage plot of historical values for a given subset signal according to at least one embodiment.
Figure 4B:
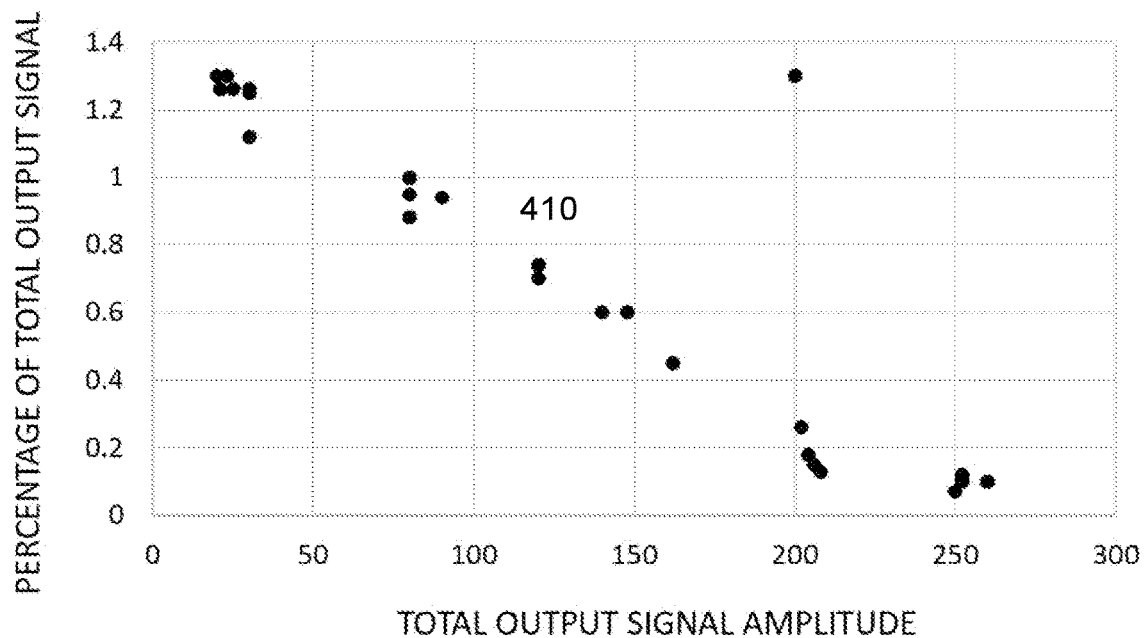
FIG. 4B is a relationship plot between those values of FIG. 4B and the respective amplitude levels of the representative time-series electrical output signal according to at least one embodiment.

Referring to FIG. 4A, an amplitude percentage plot 400 of historical values for a given subset signal (e.g., subset signal at 6.4 hertz) is shown. The subset signal is extracted from historical time-series electrical output signals for a given wind turbine according to at least one embodiment. FIG. 4B shows a relationship plot 410 between those values of FIG. 4B and the respective amplitude levels of the representative time-series electrical output signal from which such subset signals were generated according to at least one embodiment.

Figure 4C:
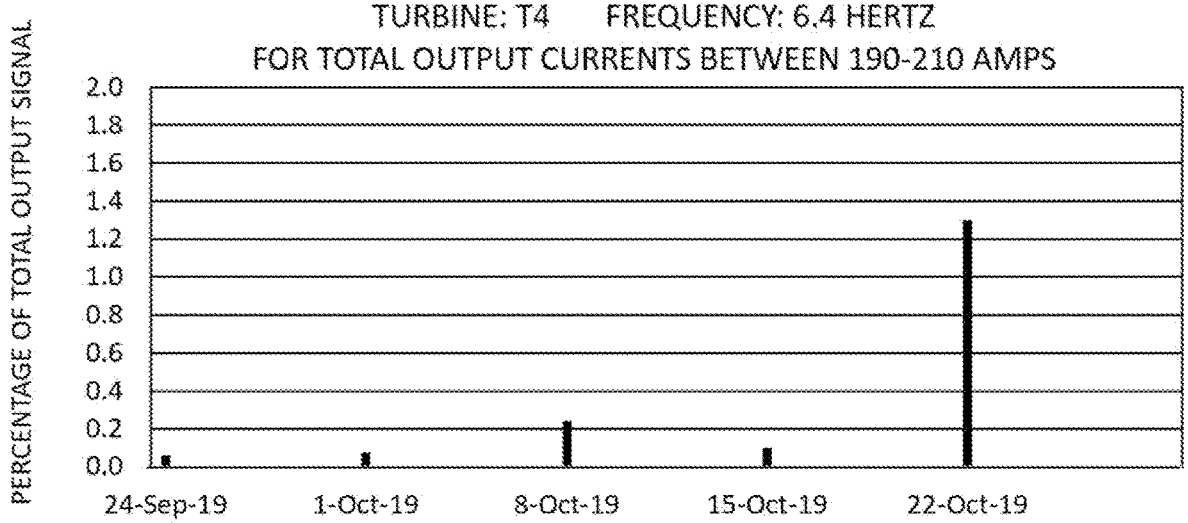
FIG. 4C is an amplitude percentage plot of historical values as shown in FIG. 4A according to at least one embodiment.

Further, FIG. 4C is an amplitude percentage plot 420 of historical values as shown in FIG. 4A, whereby such time-series electrical output signal is a current, and only those subset values recorded when such time-series electrical output signal was between 190-210 amps, are shown according to at least one embodiment.

Figure 5:
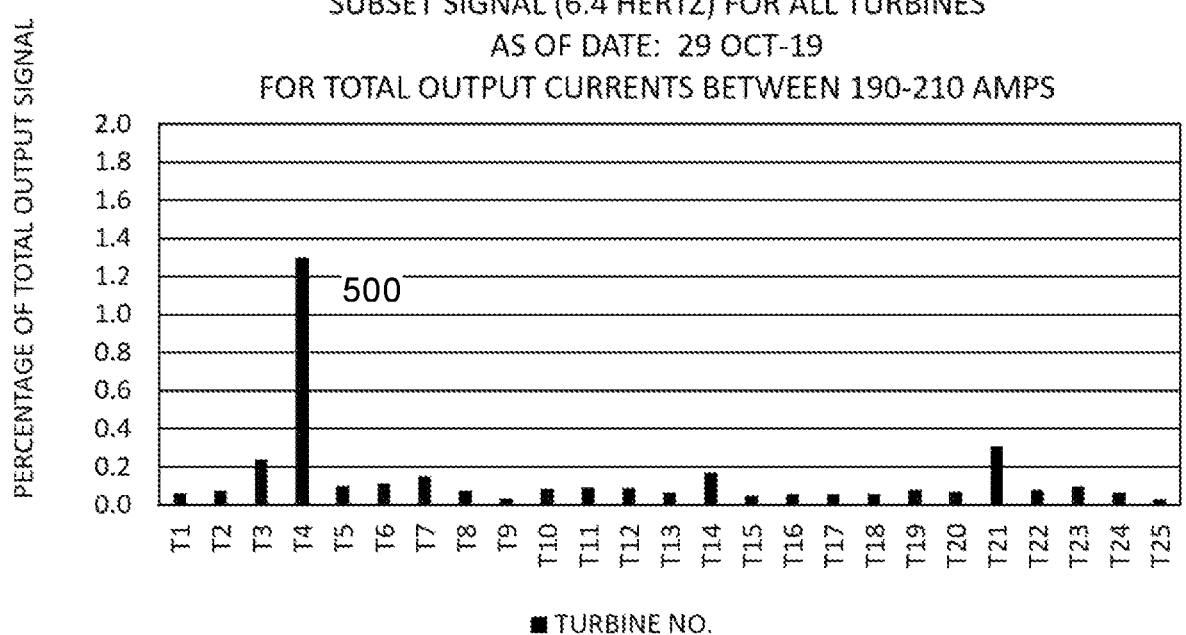
FIG. 5 is an amplitude percentage plot of a given subset signal according to at least one embodiment.

Referring to FIG. 5, an amplitude percentage plot 500 of a given subset signal (subset signal at 6.4 hertz) is shown. Each subset signal is recorded from one of a plurality of wind turbines at a given wind farm, whereby such time-series electrical output signal, from which such subset signals were extracted, was an electrical current, and only those subset values recorded when such time-series electrical output signal was between 190-210 amps, are shown according to at least one embodiment.

FIG. 6A is, for one embodiment, a table 600 showing, for a specific wind turbine, the relationship between a plurality of subset signals of interest, and their respective fault threshold values and health condition indexes, whereby such fault threshold values and health condition indexes are derived from the historical values taken from the such specific wind turbine according to at least one embodiment.

Figure 6B:
FIG. 6B is, for one embodiment, a table showing, for a specific wind turbine, the relationship between a plurality of subset signals of interest, and their respective fault threshold values and health condition indexes, according to at least one embodiment.

FIG. 6B is, for one embodiment, a table 650 showing, for a specific wind turbine, the relationship between a plurality of subset signals of interest, and their respective fault threshold values and health condition indexes, whereby such fault threshold values and health condition indexes are derived from the historical values taken from the population of wind turbines which such specific wind turbine is included according to at least one embodiment.

What is claimed is:

1. A method for performing condition monitoring of a plurality of components of a plurality of wind turbines, the method comprising:
for each of the plurality of wind turbines, measuring at least one time-series electrical output signal of a generator of the wind turbine, each time-series electrical output signal representing an aggregate of a plurality of subset signals;
mathematically extracting one or more such subset signals from the at least one time-series electrical output signal of the generator;
associating one or more such subset signals with one or more wind turbine components;
determining a fault threshold value for each such one or more subset signals;
comparing the one or more such subset signals to such fault threshold value; and determining the condition of such at least one wind turbine component of the plurality of wind turbines based on such association and comparison;

wherein comparing the subset signal to its fault threshold level includes calculating a health condition index, wherein calculating the health condition index includes comparing a number of standard deviations in which a value of the subset signal falls from a historical mean and a predetermined number of acceptable standard deviations from the historical mean, and wherein determining the condition of one or more wind turbine component includes outputting an alert when one or more such conditions exceeds a threshold value.

2. The method according to claim 1, wherein each fault threshold level being generated and/or assigned and/or compared is performed in such a manner that variations in the subset signals introduced by variations in total electrical output signal of the wind turbine generator are filtered out.

3. The method according to claim 1, wherein at least one of the measured time-series electrical output signals includes an electrical current.

4. The method according to claim 1, wherein at least one of the measured time-series electrical output signals includes an electrical voltage.

5. The method according to claim 1, wherein associating one or more subset signals with one or more wind turbine components, includes calculating at least one of a product and a ratio between a frequency of a subset signal and the frequency of the time-series electrical signal output of the generator.

6. The method according to claim 1, associating one or more subset signals with one or more wind turbine components, includes calculating at least one of a product and a ratio between a frequency of a first subset signal with the frequency of a second subset signal.

7. The method according to claim 1, wherein associating one or more subset signals with one or more wind turbine components, includes calculating at least one of a product and a ratio between a frequency of a subset signal and a frequency of a rotating element within the wind turbine.

8. The method according to claim 1, wherein associating one or more subset signals with one or more wind turbine components, includes calculating at least one of a product and a ratio between a frequency of a first subset signal and a frequency of a second subset signal.

9. The method according to claim 1, wherein associating one or more subset signals with one or more wind turbine components, includes calculating at least one of a product and a ratio between a frequency of a subset signal and a number of pole pairs within the generator of the wind turbine.

10. The method according to claim 1, wherein associating one or more subset signals with one or more wind turbine components, includes calculating at least one of a product and a ratio between a frequency of a subset signal and a number of rotor bars within the generator of the wind turbine.

11. The method according to claim 1, wherein associating one or more subset signals with one or more wind turbine components, includes calculating at least one of a product and a ratio between a frequency of a subset signal and a number of stator winding slots within the generator of the wind turbine.

12. The method according to claim 1, wherein associating one or more subset signals with one or more wind turbine components, includes calculating at least one of a product and a ratio between a frequency of a subset signal and a number of rolling elements within a bearing case within the generator of the wind turbine.

13. The method according to claim 1, wherein associating one or more subset signals with one or more wind turbine components, includes calculating at least one of a product and a ratio between a number of teeth on a first gear and with a number of teeth on a second gear within the wind turbine.

14. The method according to claim 1, wherein associating one or more subset signals with one or more wind turbine components, includes calculating at least one of a product and a ratio between a frequency of a subset signal and the physical motion of one or more moving elements within the drivetrain.

15. The method according to claim 1, wherein generating a plurality of fault threshold levels includes calculating an amplitude of at least one of a subset signal and a time-series electrical signal output of the generator.

16. The method according to claim 15, wherein generating a plurality of fault threshold levels further includes calculating a ratio between the amplitude of a subset signal and the amplitude of a time-series electrical signal output of the generator.

17. The method according to claim 15, wherein generating a plurality of fault threshold levels includes at least one of summing the amplitudes of two or more subset signals of at least one time-series electrical signal output of the generator and averaging the amplitudes of two or more subset signals of at least one time-series electrical signal output of the generator.

18. The method according to claim 17, wherein generating a plurality of fault threshold levels further includes calculating a ratio of an amplitude of a subset signal and at least one of a sum of two or more subset signals and an average of two or more subset signals.

19. The method according to claim 15, wherein generating a plurality of fault threshold levels includes comparing the amplitudes of two or more subset signals of at least one time-series electrical signal output of the generator.

20. The method according to claim 19, wherein evaluating the condition of each of the monitored wind turbine components, includes comparing the amplitudes of two or more subset signals of at least one time-series electrical signal output of the generator.

21. The method according to claim 15, wherein generating a plurality of fault threshold levels includes comparing the amplitude value of a subset signal to one or more historical amplitude values of said subset signal.

22. The method according to claim 21, wherein evaluating the condition of each of the monitored wind turbine components, includes comparing the amplitude value of a subset signal to one or more historical amplitude values of said subset signal.

23. The method according to claim 15, wherein generating fault threshold levels includes comparing subset signals corresponding to substantially identical components from at least two different wind turbines.

24. The method according to claim 23, wherein evaluating the condition of each of the monitored wind turbine components is further based on comparing subset signals corresponding to substantially identical components from at least two different wind turbines.

25. The method according to claim 15, wherein generating a fault threshold level for a given subset signal includes calculating a historical mean of historical amplitudes of said subset signal.

26. The method according to claim 25, wherein evaluating the condition of a given monitored wind turbine component includes comparing one or more associated subset signals to historical mean values of said associated subset signals.

27. The method according to claim 25, wherein generating a fault threshold level for a given subset signal includes calculating a historical standard deviation of historical amplitudes of said subset signal.

28. The method according to claim 27, wherein evaluating the condition of a given monitored wind turbine component is further based on statistically comparing one or more associated subset signals to the historical mean value of said one or more associated subset signals.

29. The method according to claim 15, wherein generating a fault threshold level for a given subset signal includes calculating a historical mean of historical amplitudes of subset signals assigned to substantially identical components from at least two different wind turbines.

30. The method according to claim 29, wherein evaluating the condition of a given monitored wind turbine component includes comparing one or more associated subset signals to historical mean values of historical amplitudes of subset signals assigned to substantially identical components from at least two different wind turbines.

31. The method according to claim 29, wherein generating a fault threshold level for a given subset signal includes calculating a historical standard deviation of historical amplitudes of subset signals assigned to substantially identical components from at least two different wind turbines.

32. The method according to claim 31, wherein evaluating the condition of a given monitored wind turbine component includes statistically comparing one or more associated subset signals to the historical mean value of historical amplitudes of subset signals assigned to substantially identical components from at least two different wind turbines.

33. The method according to claim 1, wherein calculating a health condition index includes comparing the value of the subset signal to the fault threshold level assigned to such subset signal.

34. The method according to claim 1, wherein predetermining the number of acceptable standard deviations from the mean includes calculating the number of standard deviations the fault threshold level assigned to such subset signal falls with respect to the historical mean.

35. The method according to claim 1, further comprising grouping the generated health condition indexes according to wind farm and/or according to turbine type, and/or according to turbine and/or according to monitored component and/or according to monitored components with related functions within the wind turbine and/or according to total electrical generator output level of the generator at the time of measurement, and displaying the grouped health condition indexes accordingly.

36. The method according to claim 1, wherein such alert includes at least one of an output control signal and a user notification.

37. The method according to claim 36, wherein such output control signal is connected to an input port on a control device.

38. The method according to claim 37, wherein such control device, in reaction to the received control signal, causes an adjustment to the operating state of said wind turbine in order to favorably effect a change in the condition of said wind turbine component as would be determined in subsequent executions of the method.

39. The method according to claim 38, wherein conditions of said wind turbine component as determined in at least one subsequent execution of the method are compared to the condition of said wind turbine component which had exceeded the fault threshold value prior to such subsequent execution and the results of such comparisons are used to favorably change one or more operating settings in order to effectuate a change in the operating state of the wind turbine for use in subsequent executions of the method, in order to favorably effect a change in the condition of said wind turbine component as would be determined in such subsequent executions of the method.

40. The method according to claim 36, wherein such user notification causes at least one of an inspection and a repair of said wind turbine component.

41. The method according to claim 40, wherein, the results of the inspection and/or repair of said wind turbine component are used to favorably modify the associated fault threshold fault levels so that during subsequent executions of the method at least one of minimizing false positives and providing additional advance notice of such faulty conditions are realized in subsequent executions of the method.

42. A condition monitoring system for a wind turbine, the condition monitoring system operationally coupled to a plurality of wind turbines in a wind farm, the condition monitoring system is configured to:
for each wind turbine of the plurality of wind turbines, measure at least one time-series electrical output signal of a generator of the wind turbine, each time-series electrical output signal representing an aggregate of a plurality of subset signals;
mathematically extract one or more such subset signals from the at least one time-series electrical output signal of the generator;
associate one or more such subset signals with one or more wind turbine components;
determine a fault threshold value for each such one or more subset signals;
compare the one or more such subset signals to such fault threshold value; and
determine the condition of such at least one wind turbine component of the plurality of wind turbines based on such association and comparison, wherein comparing the subset signal to its fault threshold level includes calculating a health condition index, wherein calculating the health condition index includes comparing a number of standard deviations in which a value of the subset signal falls from the historical mean and a predetermined number of acceptable standard deviations from the historical mean, and wherein determining the condition of one or more wind turbine component includes outputting an alert when one or more such conditions exceeds a threshold value.

43. The condition monitoring system according to claim 42, wherein each fault threshold level being generated and/or assigned and/or compared is performed in such a manner that variations in the subset signals introduced by variations in total electrical output signal of the generator are filtered out.

44. The condition monitoring system according to claim 42, wherein at least one of the measured time-series electrical output signals includes an electrical current.

45. The condition monitoring system according to claim 42, wherein at least one of the measured time-series electrical output signals includes an electrical voltage.

46. The condition monitoring system according to claim 42, wherein associating one or more subset signals with one or more wind turbine components, includes calculating at least one of a product and a ratio between a frequency of a subset signal and the frequency of the time-series electrical signal output of the generator.

47. The condition monitoring system according to claim 42, associating one or more subset signals with one or more wind turbine components, includes calculating at least one of a product and a ratio between a frequency of a first subset signal with the frequency of a second subset signal.

48. The condition monitoring system according to claim 42, wherein associating one or more subset signals with one or more wind turbine components, includes calculating at least one of a product and a ratio between a frequency of a subset signal and a frequency of a rotating element within the wind turbine.

49. The condition monitoring system according to claim 42, wherein associating one or more subset signals with one or more wind turbine components, includes calculating at least one of a product and a ratio between a frequency of a first subset signal and a frequency of a second subset signal.

50. The condition monitoring system according to claim 42, wherein associating one or more subset signals with one or more wind turbine components, includes calculating at least one of a product and a ratio between a frequency of a subset signal and a number of pole pairs within the generator of the wind turbine.

51. The condition monitoring system according to claim 42, wherein associating one or more subset signals with one or more wind turbine components, includes calculating at least one of a product and a ratio between a frequency of a subset signal and a number of rotor bars within the generator of the wind turbine.

52. The condition monitoring system according to claim 42, wherein associating one or more subset signals with one or more wind turbine components, includes calculating at least one of a product and a ratio between a frequency of a subset signal and a number of stator winding slots within the generator of the wind turbine.

53. The condition monitoring system according to claim 42, wherein associating one or more subset signals with one or more wind turbine components, includes calculating at least one of a product and a ratio between a frequency of a subset signal and the number of rolling elements within a bearing case within the generator of the wind turbine.

54. The condition monitoring system according to claim 42, wherein associating one or more subset signals with one or more wind turbine components, includes calculating at least one of a product and a ratio between a number of teeth on a first gear and with a number of teeth on a second gear within the wind turbine.

55. The condition monitoring system according to claim 42, wherein associating one or more subset signals with one or more wind turbine components, includes calculating at least one of a product and a ratio between a frequency of a subset signal and the physical motion of one or more moving elements within the drivetrain.

56. The condition monitoring system according to claim 42, wherein generating a plurality of fault threshold levels includes calculating an amplitude of at least one of a subset signal and a time-series electrical signal output of the generator.

57. The condition monitoring system according to claim 56, wherein generating a plurality of fault threshold levels further includes calculating a ratio between the amplitude of a subset signal and the amplitude of a time-series electrical signal output of the generator.

58. The condition monitoring system according to claim 56, wherein generating a plurality of fault threshold levels includes at least one of summing the amplitudes of two or more subset signals of at least one time-series electrical signal output of the generator and averaging the amplitudes of two or more subset signals of at least one time-series electrical signal output of the generator.

59. The condition monitoring system according to claim 58, wherein generating a plurality of fault threshold levels further includes calculating a ratio of an amplitude of a subset signal and at least one of a sum of two or more subset signals and an average of two or more subset signals.

60. The condition monitoring system according to claim 56, wherein generating a plurality of fault threshold levels includes comparing the amplitudes of two or more subset signals of at least one time-series electrical signal output of the generator.

61. The condition monitoring system according to claim 60, wherein evaluating the condition of each of the monitored wind turbine components, includes comparing the amplitudes of two or more subset signals of at least one time-series electrical signal output of the generator.

62. The condition monitoring system according to claim 56, wherein generating a plurality of fault threshold levels includes comparing the amplitude value of a subset signal to one or more historical amplitude values of said subset signal.

63. The condition monitoring system according to claim 62, wherein evaluating the condition of each of the monitored wind turbine components, includes comparing the amplitude value of a subset signal to one or more historical amplitude values of said subset signal.

64. The condition monitoring system according to claim 56, wherein generating fault threshold levels includes comparing subset signals corresponding to substantially identical components from at least two different wind turbines.

65. The condition monitoring system according to claim 64, wherein evaluating the condition of each of the monitored wind turbine components is further based on comparing subset signals corresponding to substantially identical components from at least two different wind turbines.

66. The condition monitoring system according to claim 56, wherein generating a fault threshold level for a given subset signal includes calculating a historical mean of historical amplitudes of said subset signal.

67. The condition monitoring system according to claim 66, wherein evaluating the condition of a given monitored wind turbine component includes comparing one or more associated subset signals to historical mean values of said associated subset signals.

68. The condition monitoring system according to claim 66, wherein generating a fault threshold level for a given subset signal includes calculating a historical standard deviation of historical amplitudes of said subset signal.

69. The condition monitoring system according to claim 68, wherein evaluating the condition of a given monitored wind turbine component is further based on statistically comparing one or more associated subset signals to the historical mean value of said one or more associated subset signals.

70. The condition monitoring system according to claim 56, wherein generating a fault threshold level for a given subset signal includes calculating a historical mean of historical amplitudes of subset signals assigned to substantially identical components from at least two different wind turbines.

71. The condition monitoring system according to claim 70, wherein evaluating the condition of a given monitored wind turbine component includes comparing one or more associated subset signals to historical mean values of historical amplitudes of subset signals assigned to substantially identical components from at least two different wind turbines.

72. The condition monitoring system according to claim 70, wherein generating a fault threshold level for a given subset signal includes calculating a historical standard deviation of historical amplitudes of subset signals assigned to substantially identical components from at least two different wind turbines.

73. The condition monitoring system according to claim 72, wherein evaluating the condition of a given monitored wind turbine component includes statistically comparing one or more associated subset signals to the historical mean value of historical amplitudes of subset signals assigned to substantially identical components from at least two different wind turbines.

74. The condition monitoring system according to claim 42, wherein calculating a health condition index includes comparing the value of the subset signal to the fault threshold level assigned to such subset signal.

75. The condition monitoring system according to claim 42, wherein predetermining the number of acceptable standard deviations from the mean includes calculating the number of standard deviations the fault threshold level assigned to such subset signal falls with respect to the historical mean.

76. The condition monitoring system according to claim 42, further comprising grouping the generated health condition indexes according to wind farm and/or according to turbine type, and/or according to turbine and/or according to monitored component and/or according to monitored components with related functions within the wind turbine and/or according to total electrical generator output level of the wind turbine generator at the time of measurement, and displaying the grouped health condition indexes accordingly.

77. The condition monitoring system according to claim 42, wherein such alert includes at least one of an output control signal and a user notification.

78. The condition monitoring system according to claim 77, wherein such output control signal is connected to an input port on a control device.

79. The condition monitoring system according to claim 78, wherein such control device, in reaction to the received control signal, causes an adjustment to the operating state of said wind turbine in order to favorably effect a change in the condition of said wind turbine component as would be determined in subsequent uses of the system.

80. The condition monitoring system according to claim 79, wherein conditions of said wind turbine component as determined in at least one subsequent uses of the system are compared to the condition of said wind turbine component which had exceeded the fault threshold value prior to such subsequent execution and the results of such comparisons are used to favorably change one or more operating settings in order to effectuate a change in the operating state of the wind turbine for use in subsequent uses of the system, in order to favorably effect a change in the condition of said wind turbine component as would be determined in such subsequent uses of the system.

81. The condition monitoring system according to claim 77, wherein such user notification causes at least one of an inspection and a repair of said wind turbine component.

82. The condition monitoring system according to claim 81, wherein, the results of the inspection and/or repair of said wind turbine component are used to favorably modify the associated fault threshold fault levels so that during subsequent uses of the system at least one of minimizing false positives and providing additional advance notice of such faulty conditions are realized in subsequent uses of the system.

\* \* \* \* \*